(12) United States Patent
Singleton et al.

(10) Patent No.: US 6,885,533 B2
(45) Date of Patent: Apr. 26, 2005

(54) ELECTROMAGNETIC PROTECTOR APPLICATION SPECIFIC INTEGRATED CIRCUIT (ASIC)

(75) Inventors: William C. Singleton, Manassas, VA (US); Scott C. Willis, Fairfax Station, VA (US)

(73) Assignee: BAE Systems Information and Electronic Systems Integration Inc., Nashu, NH (US)

( * ) Notice: Subject to any disclaimer, the term of this patent is extended or adjusted under 35 U.S.C. 154(b) by 210 days.

(21) Appl. No.: 10/282,349

(22) Filed: Oct. 29, 2002

(65) Prior Publication Data

US 2004/0028167 A1 Feb. 12, 2004

Related U.S. Application Data

(60) Provisional application No. 60/350,156, filed on Oct. 29, 2001.

(51) Int. Cl.[7] .............................................. G08B 17/12
(52) U.S. Cl. .......................................... 361/111; 361/56
(58) Field of Search .......................... 361/111, 56, 91.1, 361/91.5

(56) References Cited

U.S. PATENT DOCUMENTS

| 4,573,168 A | * | 2/1986 | Henze et al. ................ 375/257 |
| 5,359,211 A | * | 10/1994 | Croft ........................... 257/173 |
| 5,617,283 A | * | 4/1997 | Krakauer et al. ............. 361/56 |

FOREIGN PATENT DOCUMENTS

GB           0 375 120     *  6/1990    ............. G01T/1/24

* cited by examiner

*Primary Examiner*—Brian Sircus
*Assistant Examiner*—Zeev Kitov
(74) *Attorney, Agent, or Firm*—Simpson & Simpson, PLLC

(57) ABSTRACT

An electromagnetic protection ASIC that includes a high transconductance FET switch array operatively arranged to momentarily short all lines of ingress/egress to ground when triggered by a nuclear event detector.

7 Claims, 2 Drawing Sheets

ELECTROMAGNETIC PROTECTOR APPLICATION SPECIFIC INTEGRATED CIRCUIT (ASIC)

RELATED APPLICATION

This non-provisional patent application claims the benefit under 35 U.S.C. §119(e) of U.S. Provisional Application Ser. No. 60/350,156, filed Oct. 29, 2001, which is incorporated by reference herein.

FIELD OF THE INVENTION

The present invention relates generally to integrated circuits, more particularly to application specific integrated circuits (ASICs) and, even more particularly, to an electromagnetic protector application specific integrated circuit.

BACKGROUND OF THE INVENTION

The present invention is intended to provide protection for a variety of electrical and electronic devices against the effects of electromagnetic pulses (EMPs), high energy radio frequency (HERF) electromagnetic effects, and effects produced by flux compression generators (FCG), magneto-hydrodynamic generators (MHD), virtual cathode oscillators (vircator), and the like.

EMPs are characterized by short but intense bursts of electromagnetic energy, which propagate away from their source with diminishing intensity. These electromagnetic shock waves can produce transient voltages of thousands of volts, sufficient to cause irreversible damage to a variety of electrical and electronic systems and devices. A complete description of the problem addressed by the present invention is found in Kopp, Carlo, "The E-Bomb—a Weapon of Electrical Mass Destruction", Department of Computer Science, Monash University, Clayton, Australia, published on the Internet at www.infowar.com/mil_c4i/mil_c4i8.html-ssi, and incorporated herein by reference. Another description of the problem can be found at Maxwell Technologies, Inc.'s website at www.maxwell.com/microelectronics/products/neds/neds_detail.html, (Maxwell Technologies, Inc., San Diego, Calif.) which describes the problem as follows:

> The short pulse of ionizing radiation produced by a nuclear weapon presents a major threat to military electronics. This radiation is normally in the form of x-rays or gamma rays, which generate excess electron-hole pairs within all semiconductor devices. These excess electron-hole pairs result in a transient leakage current, called photocurrent, across reverse biased junctions. The transient photocurrents can cause devices to upset or to be permanently damaged. Circumvention encompasses all of the design features required to prevent this upset or permanent damage from ionizing radiation pulses. Using circumvention, the upset-hardening requirements for the majority of the system have been reduced or eliminated, thus minimizing the impact of nuclear hardening on the overall system.

A variety of solutions are known in the art to "harden" electrical circuits to avoid damage from EMPs, including transorbs and optical isolation techniques. What is needed, though, is a cost effect, low capacitance solution that minimizes the effects of data line loading and is easier to retrofit into existing circuitry.

There is thus a longfelt need for an electromagnetic protection ASIC.

SUMMARY OF THE INVENTION

The present invention broadly comprises an electromagnetic protection ASIC.

A general object of the present invention is to provide an electromagnetic protection ASIC that will provide EMP and HERF weapon protection to a variety of electrical and electronic systems and apparatuses.

These and other objects, features and advantages of the present invention will become readily apparent from the following detailed description of the invention in view of the drawing figure and appended claims.

DETAILED DESCRIPTION OF THE PREFERRED EMBODIMENT

Figure 1:
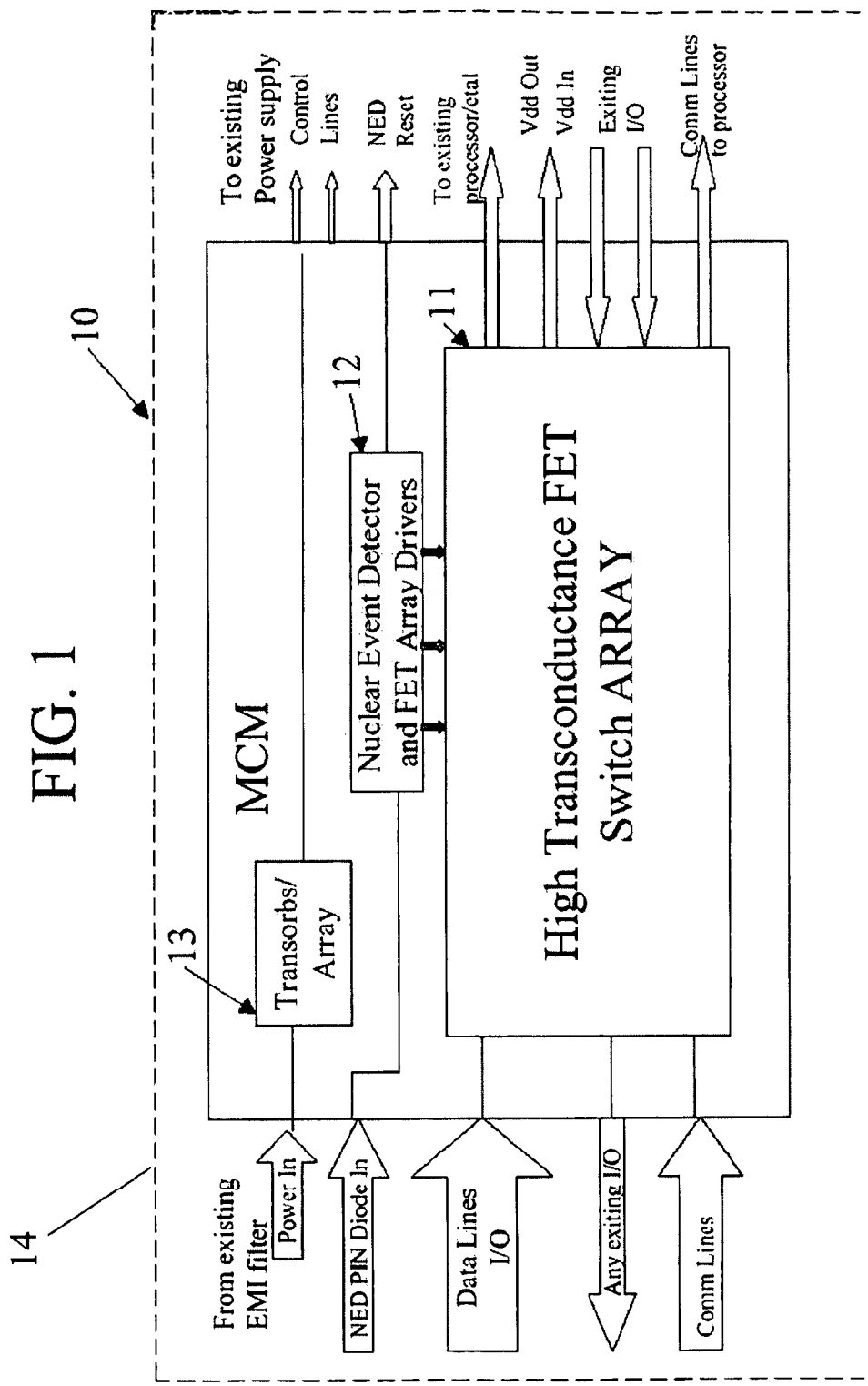
FIG. 1 is a block diagram of the present invention.

A general block diagram of the electromagnetic protection ASIC of the present invention is shown in FIG. 1.

Electromagnetic protection ASIC 10 broadly comprises high transconductance FET switch array 11, driven by nuclear event detector (NED) 12, and associated FET array drivers. In a preferred embodiment, response time of the array to the NED is measured in picoseconds. The nuclear event detector (NED) is well known in the art and commercially available, as are the driver circuits. In a preferred embodiment, an NED from Maxwell Technologies, Inc., San Diego, Calif., may be used, such as Models HSN-3000, HSN-2000, HSN-1000 or HSH-500. In operation, the NED model HSN-3000, for example, senses ionizing radiation pulses generated by a nuclear event, such as the detonation of a nuclear weapon, and rapidly switches its outputs from the normal high state to a low state with a propagation delay time of less than 20 ns. The active low nuclear event detection signal is used to initiate the circumvention function of the present invention, namely activation of the drivers of the high transconductance FET switch array 11 of the invention.

Figure 1A:
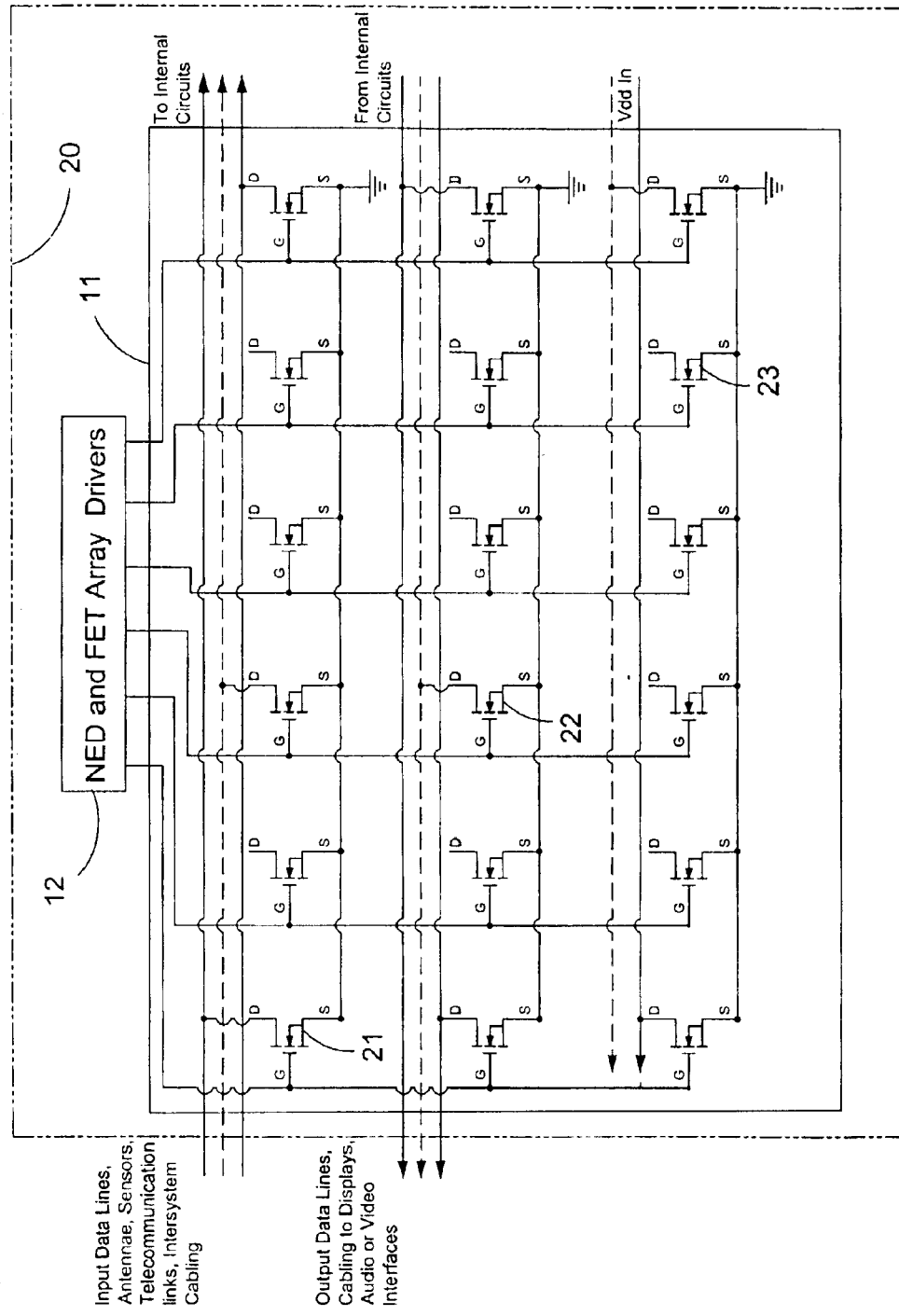
FIG. 1A is a drawing similar to that of FIG. 1, except showing schematically the FET array within the high transconductance FET switch array 11 of FIG. 1.

Circuit operation is straightforward. The chip itself may be connected within any electrical or electronic device to be protected, as shown in FIGS. 1 and 1A. All input, output, communication, data and power lines, indeed all lines of the device are connected to, and protected by the circuit of the present invention. Within picoseconds of the NED trigger event, the switch array momentarily shorts all lines of ingress and egress (e.g., data, communication, antennae) to ground instantaneously. Of course, when this occurs, all in-process data/intelligence is lost. However, the system itself is not damaged by electromagnetic pulses (EMPs) of any origin (solar, lightning, FCG bomb, etc.). Input power lines are also snubbed.

In a preferred embodiment, transorb-like devices 13 are located just after or inside the EMI filter's dirty box 14. If properly shielded, the avalanching diodes could be located on the back-side of the ASIC for retrofit purposes.

To preserve speed and performance, it is preferred that the ASIC FETs not constitute significant capacitive loading.

The present invention is suitable for use in any electronic system that must/should survive an EMP or high-energy radio frequency (HERF) weapon attack. These include, but are not limited to, personal computers, communication, transportation, military, accounting, security, food services, entertainment, and energy management/distribution systems.

Adverting to FIG. 1A, it is seen that the invention broadly comprises a high transconductance FET switch array 11, driven by Nuclear Event Detector and FET Array Drivers 12. The FET switch array 11 is seen to comprise a plurality of FETS, of which FETS 21, 22 and 23 are labeled. The gates of all FETS in the array are connected to the FET Array Drivers which, in turn, are activated by the NED. The sources of all FETS are connected to ground, whereas the drains are all connected to input, output, data, communication and power lines to be protected It should be appreciated that, in a preferred or practical embodiment, more than one FET source may be connected to the same line to be protected, to handle the expected current upon activation of the protection device. In operation, then, should the NED detect an event, its associated drivers send appropriate signals to the gates of each FET in the array, activating the FET switch, and shunting the drain to source (ground) thereby protecting the electronic device.

Thus, it is seen that the objects of the invention are efficiently obtained, although it should be readily apparent to those having ordinary skill in the art that changes and modifications to the invention, such as those recited above, can be made to the circuit without departing from the scope and spirit of the claims.

What is claimed is:

1. An apparatus for protecting an electronic device from electromagnetic effects comprising:

a nuclear event detector coupled to associated field effect transistor (FET) array drivers;

a plurality of electrical lines, where all lines of ingress/egress to said device are connected to said plurality of electrical lines; and, a plurality of FETs arranged in an array, where gates of said FETs are connected to said FET array drivers, drains of said FETs are connected to said plurality of electrical lines, and sources of said FETs are connected to round, where said apparatus is operatively arranged to momentarily short said all lines of ingress/egress to ground when triggered by said nuclear event detector.

2. The apparatus recited in claim 1 further comprising transorb-like devices operatively arranged to snub input power lines of said device.

3. The apparatus recited in claim 2 wherein said transorb-like devices are located in a circuit just after an electromagnetic interference filter dirty box.

4. The apparatus recited in claim 2 wherein said transorb-like devices are located inside an electromagnetic interference filter dirty box.

5. The apparatus recited in claim 1 further comprising avalanching diodes operatively arranged to allow existing electronic circuits to be retrofitted with said apparatus.

6. The apparatus recited in claim 5 wherein said avalanching diodes are located on a backside of said apparatus.

7. An article of manufacture comprising a personal computer comprising the apparatus of claim 1.

* * * * *

UNITED STATES PATENT AND TRADEMARK OFFICE
CERTIFICATE OF CORRECTION

PATENT NO. : 6,885,533 B2
DATED : April 26, 2005
INVENTOR(S) : William C. Singleton and Scott C. Willis It is certified that error appears in the above-identified patent and that said Letters Patent is hereby corrected as shown below:

<u>Column 3, line 29 - Column 4, lines 1-12,</u>
Claim 1, should read:
-- 1.  An apparatus for protecting an electronic device from electromagnetic effects comprising:
   a nuclear event detector coupled to associated field effect transistor (FET) array drivers;
   a plurality of electrical lines, where all lines of ingress/egress to said device are connected to said plurality of electrical lines; and,
   a plurality of FETs arranged in an array, where gates of said FETs are connected to said FET array drivers, drains of said FETs are connected to said plurality of electrical lines, and sources of said FETs are connected to ground, where said apparatus is operatively arranged to momentarily short said all lines of ingress/egress to ground when triggered by said nuclear event detector. --

Signed and Sealed this

Fifth Day of July, 2005

JON W. DUDAS
*Director of the United States Patent and Trademark Office*